(12) United States Patent
Nagatomo et al.

(10) Patent No.: US 6,310,775 B1
(45) Date of Patent: Oct. 30, 2001

(54) POWER MODULE SUBSTRATE

(75) Inventors: Yoshiyuki Nagatomo; Toshiyuki Nagase; Kazuaki Kubo; Shoichi Shimamura, all of Omiya (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/531,489

(22) Filed: Mar. 20, 2000

(30) Foreign Application Priority Data

Mar. 24, 1999 (JP) .................................................. 11-079554
Sep. 8, 1999 (JP) .................................................. 11-254259
Jan. 11, 2000 (JP) .................................................. 12-002700

(51) Int. Cl.$^7$ ..................................................... H05K 7/20
(52) U.S. Cl. ......................... 361/707; 165/185; 257/719; 361/719; 428/901
(58) Field of Search ................................. 165/80.3, 80.4, 165/185; 174/252; 228/121; 257/706, 707, 712–714, 717, 750; 428/901, 209, 210; 361/699, 704, 705, 713, 707–711, 715, 717–719

(56) References Cited

U.S. PATENT DOCUMENTS

| | | |
|---|---|---|
| 5,130,498 | 7/1992 | Yoshida et al. . |
| 5,213,877 | 5/1993 | Yoshida et al. . |
| 5,358,774 | * 10/1994 | Garvens ................................. 428/209 |
| 5,395,679 | * 3/1995 | Myers et al. ........................... 428/209 |
| 5,451,279 | 9/1995 | Kohinata et al. . |
| 5,591,034 | * 1/1997 | Ameen et al. ........................... 439/91 |
| 5,675,474 | 10/1997 | Nagase et al. . |
| 5,786,633 | * 7/1998 | Wolfgang et al. ..................... 257/706 |
| 5,828,127 | * 10/1998 | Yamagata et al. ..................... 257/706 |
| 5,981,085 | * 11/1999 | Ninomiya et al. ..................... 428/614 |
| 6,033,787 | 3/2000 | Nagase et al. . |
| 6,201,696 | * 3/2001 | Shimizu et al. . |

* cited by examiner

*Primary Examiner*—Gerald Tolin
(74) *Attorney, Agent, or Firm*—Oblon, Spivak, McClelland, Maier & Neustadt, P.C.

(57) ABSTRACT

The present invention for solving the problem of suppressing the load caused by heat stress applied on an insulation substrate, reducing the manufacturing coat of a power module substrate, and improving productivity provides a power module substrate in which a buffer layer having a surface area one to three times as large as the surface area of the insulation substrate is laminated and bonded between the insulation substrate and the heat sink, wherein the buffer layer is formed using a material having a thermal expansion coefficient between the thermal expansion coefficients of the insulation substrate and the heat sink, the insulation substrate being preferably formed using AlN, $Si_3N_4$ or $Al_2O_3$, the buffer layer being preferably formed using AlSiC, and a carbon plate or a composite material of AlC, besides the thickness of the buffer layer being preferably 1.5 to 50 times as large as the thickness of the insulation substrate, and the insulation substrate, the buffer layer and the heat sink being preferably laminated via a brazing foil by bonding.

6 Claims, 3 Drawing Sheets

POWER MODULE SUBSTRATE

BACKGROUND OF THE INVENTION

1. Field of the Invention

The present invention relates to a power module to be used in semiconductor devices for controlling high voltages and large electric current for use in electric vehicles such as electric automobiles and electric trains. In more detail, the present invention relates to a power module substrate having a heat sink for dissipating the heat generated from heating elements such as semiconductor chips.

2. Description of the Related Art

In the conventional power modules as described above, an insulation substrate 2 has been made of a material such as AlN, a circuit layer 6 and a metallic layer 7 have been laminated and bonded on the insulation substrate 2 via a brazing foil, and the metallic layer 7 has been bonded to a heat spreader 8 of a heat sink 3 formed of AlSiC via a first solder layer 5a as shown in FIG. 5. A semiconductor chip 4 is bonded to the circuit layer 6 via a second solder layer 5b, while a water cooled sink 9 is attached to the radiator 8 using external threads 9c (such as pan-head screws). A cooling water flow path 9b for flowing cooling water to flow through is provided within the water cooled sink 9.

Relatively a large amount of heat is generated from the semiconductor chip 4 in the power module substrate having the construction as described above. However, the power module substrates 1 are prevented from being overheated, because the heat generated in the semiconductor chip 4 is transferred to the water cooled sink 9 through the second solder layer 5b, the circuit layer 6, the insulation substrate 2, the metallic layer 7, the first solder layer 5a and the heat spreader 8; cooling water 9a flowing through the cooling water flow path 9b receives the heat and carries it out of the power module substrates 1.

However, it was a problem that the production coast increases in the conventional power module substrates 1 since the large size heat spreader 8 is made of relatively expensive AlSiC.

It was also a problem in the conventional power module substrate 1 that heat cycle service life of the first solder layer 5a is shortened due to difference in deformation of the insulation substrate 2 and the radiator 8 caused by different thermal expansion coefficients between the insulation substrate 2 and the heat spreader 8.

It was an another problem that man-hour for assembling was increased in the conventional power module substrate 1, because the met allic layer 7 should be bonded to the radiator 8 via the first solder layer 5a in a separate process from lamination and bonding of the circuit layer 6 and the metallic layer 7 on the insulation substrate 2.

For solving these problems, a power module substrate 1 as shown in FIG. 6 has been disclosed, wherein the metallic layer 7 is bonded to the heat spreader 8 using the same brazing foil as the brazing foil (not shown) used for lamination and bonding of the circuit layer 6 and the metallic layer 7 on the upper face and lower faces of the insulation substrate 2, respectively.

The problem of shortening the heat-cycle service life can be solved in the power module 1 having the construction as described above, since the first solder layer is not used for bonding the insulation substrate 2 and the heat spreader 8, besides allowing the metallic layer 7 to be bonded to the heat spreader 8 simultaneously with lamination and bonding of the circuit layer 6 and the metallic layer 7 on the insulation substrate 2.

However, manufacturing cost has been increased yet in the improved power module substrate as described above, because the large size radiator is formed using relatively expensive AlSiC.

SUMMARY OF THE INVENTION

Accordingly, the object of the present invention is to provide a power module substrate that can reduce the load caused by heat stress on the insulation substrate, and is able to diminish the manufacturing cost, besides further improving productivity.

An another object of the present invention is to provide a power module substrate that can improve cooling efficiency by the heat sink, while preventing the solder layer for bonding semiconductor chips on the circuit layer from being degraded.

In a first aspect, the present invention provides a power module substrate in which a buffer layer 14 having a surface area one to three times as large as the surface area of an insulation substrate 12 is inserted with bonding between the insulation substrate 12 and a heat sink 13 as shown in FIG. 1, wherein the buffer layer 14 is formed using a material having a thermal expansion coefficient between the thermal expansion coefficient of the insulation substrate 12 and the thermal expansion coefficient of the heat sink 13.

Since the difference in deformation between the insulation substrate 12 and the heat sink 13 due to difference of the thermal expansion coefficients between the insulation substrate 12 and the heat sink 13 is absorbed by the buffer layer 14 in the power module according to the first aspect of the present invention, internal stress generated in the insulation substrate 12 is reduced thereby to suppress the load caused by heat stress of the insulation substrate 12.

Preferably, AlN, $Si_3N_4$ or $Al_2O_3$ is used for the insulation substrate 12, Al or Cu is used for the heat sink 13, and AlSiC, a carbon plate or an AlC composite material is used for the buffer layer 14 as shown in FIG. 1.

Since the heat sink 13 is formed using Al or Cu in the power module substrate as described above, the production cost may be reduced as compared with the conventional power module in which the heat spreader is formed using expensive AlSiC.

The buffer layer 14 preferably has a thickness 1.5 to 50 times as large as the thickness of the insulation substrate 12.

Since the difference of deformation between the insulation substrate 12 and the heat sink 13 caused by the difference of the thermal expansion coefficients between the insulation substrate 12 and the heat sink 13 is more securely absorbed by the buffer layer 14, the load caused by the heat stress on the insulation substrate 12 is certainly suppressed.

Preferably, the insulation layer 12, the buffer layer 14 and the heat sink 13 are laminated and bonded via a brazing foil as shown in FIG. 1.

Productivity of the power module substrate 11 may be improved in the power module substrate as described above, because an integrated member of the insulation substrate 12, the buffer layer 14 and the heat sink 13 is manufactured through one step heat treatment.

Preferably, the power module substrate comprises a heat spreader 48 in which the heat sink 13 is bounded to the buffer layer 14, and a water-cooled sink 19, which is attached to the radiator 48 and in which a cooling water flow path 19b for allowing the cooling water 19a to flow through, is formed as shown in FIG. 2, wherein a groove (or a recess) 48a capable of inserting the buffer layer 14 is formed on the surface of the heat spreader 48, and the buffer layer 14 is bounded to the radiator 48 by being inserted into the groove 48a.

The heat may be promptly transferred to the water cooled sink 19 from the buffer layer 14 through the heat spreader 48 in the power module substrate as described above, because the buffer layer 14 may be placed close to the water cooled sink 19. Consequently, cooling efficiency by the heat sink 13 may be improved to prevent the power module substrate 41 from being overheated, because cooling water 19a flowing through the cooling water flow path 19b of the water cooled sink 19 receives the heat to take out it of the power module substrate 41.

Preferably, the power module substrate comprises a water cooled heat sink 73 in which a cooling water flow path 73b for allowing cooling water 73a to flow through is formed; the buffer layer 14 being directly laminated on and bonded to the water cooled heat sink 73 via the brazing foil.

The heat may be promptly transferred from the buffer layer 14 to the water cooled heat sink 73, since the buffer layer 14 is directly laminated on and bonded to the water cooled heat sink 73 via the brazing foil in the power module substrate 71 as described above. Consequently, cooling efficiency is further improved to prevent the power module substrate 71 from being overheated, because cooling water 73a flowing through the water cooled heat sink 73 takes the heat out of the power module substrate 71.

Preferably, a circuit layer (16) is formed on the insulation layer (12), and a semiconductor chip (23) is attached to the circuit layer (16) via the solder layer (22) as shown in FIG. 1.

Since the difference in the heat of expansion or the difference of deformation by heat contraction between the insulation substrate 12 and heat sink 13 is absorbed by the buffer layer 14 in the power module substrate as described above, the solder layer 22 is prevented from being degraded.

DESCRIPTION OF THE PREFERRED EMBODIMENT

The first embodiment of the present invention will be described hereinafter with reference to the drawings.

Figure 1:
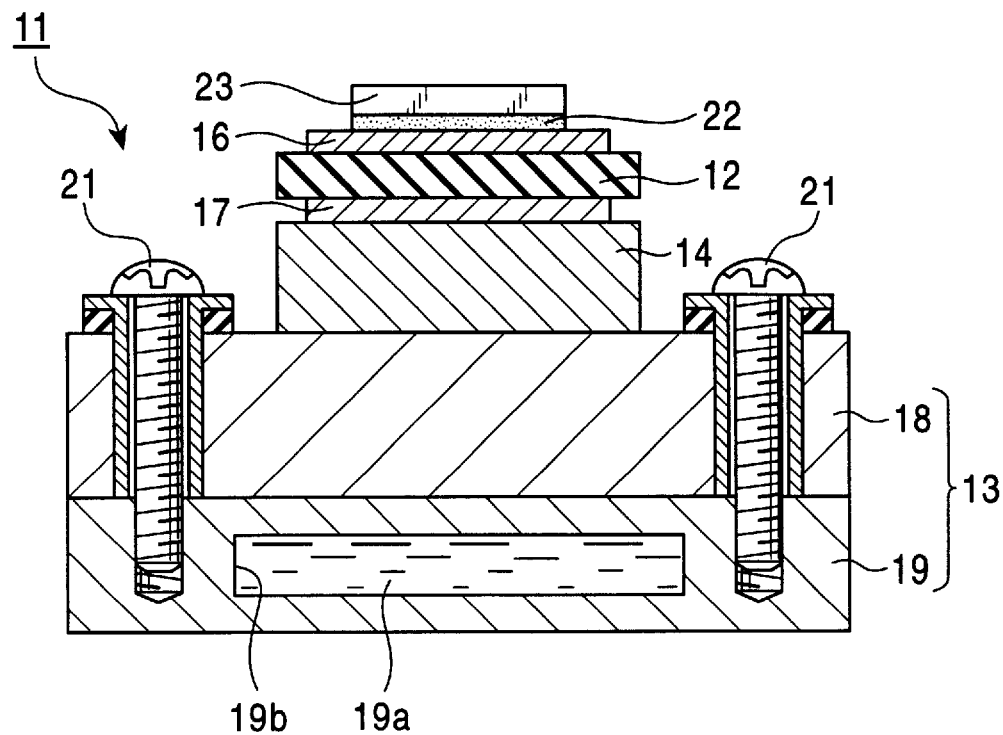
FIG. 1 is a cross section of the power module substrate according to the first embodiment of the present invention.

As shown in FIG. 1, the power module substrate 11 is provided with an insulation substrate 12, a heat sink 13, and a buffer layer 14 laminated by bonding between the insulation substrate 12 and the heat sink 13. The insulation substrate 12 is formed using AlN, $Si_3N_4$ or $Al_2O_3$, and a circuit layer 16 and a metallic layer 17 are laminated on and bonded to the upper face and lower face of the insulation substrate 12, respectively. The circuit layer 16 and the metallic layer 17 are formed into a thickness of 0.1 to 0.5 mm using Al or Cu. The heat sink 13 comprises a heat spreader 18 and a water cooled sink 19 attached to the heat spreader 18 using external threads 21 (for example, pan-screws). The heat spreader 18 is formed using Al or Cu, and has a surface area one to three times as large as the surface area of the insulation substrate 12. The water cooled sink 19 is formed using Al an Cu, in which a cooling water flow path 19b for allowing cooling water 19a to flow through is formed.

The buffer layer 14 is preferably formed using a material having a thermal expansion coefficient between the thermal expansion coefficient of the insulation substrate 12 and the thermal expansion coefficient of the heat sink 13, or using AlSiC, a carbon plate or an AlC composite material. The thermal expansion coefficients of AlN, $Si_3N_4$ and $Al_2O_3$ are about $4.3\times10^{-6}/°$ C., about $2.8\times10^{-6}/°$ C. and $7.3\times10^{-6}/°$ C., respectively, the thermal expansion coefficients of Al and Cu are about $25\times10^{-6}/°$ C., and about $16.5\times10^{-6}/°$ C., respectively, and the thermal expansion coefficients of AlSiC is about $7.5\times10^{-6}/°$ C.

The buffer layer 14 preferably has a surface area one to three times, preferably one time to twice, as large as the surface area of the insulation substrate 12. Or, the buffer layer 14 is formed to have a smaller surface area than the surface area of heat spreader 18. The surface area of the buffer layer 14 is limited within the range of one to three times of the surface area of the insulation substrate 12 because, when the surface area is equal or less, the heat dissipated from a semiconductor chip to be described hereinafter can not be promptly transferred to the heat spreader 18 while, when the area is three times or more, the production cost increases. It is also preferable that the thickness of the buffer layer 14 is 1.5 to 50 times as large as the thickness of the insulation substrate 12. The range of the thickness of the buffer layer 14 is limited within the range of 1.5 to 50 times because, when the thickness is less than 1.5 times, the buffer layer can not sufficiently absorb the difference of deformation between the insulation substrate 12 and the heat sink 13 caused by the difference of the thermal expansion coefficients between the insulation substrate 12 and the heat sink 13 while, when the thickness is over 50 times, the power module substrate 11 turns out to be large size to increase the production cost.

The insulation substrate 12, the buffer layer 14 and the heat sink 13 are laminated and bonded via a brazing foil (not shown). When the metallic layer 17 and the heat spreader 18 are formed using Al, an Al—Si alloy comprising 87.0 to 96.0% by weight of Al and 4.0 to 13.0% by weight of Si is preferably used for the brazing foil. When the metallic layer 17 and the heat spreader 18 are formed using Cu, on the other hand, an Ag—Cu—Ti alloy comprising 34 to 73% by weight of Ag, 14 to 35% by weight of Cu and 0 to 20% by weight of Ti is preferably used for the brazing foil. A semiconductor chip 23 is attached to the circuit layer 16 on the surface of the insulation substrate 12.

The method for manufacturing the power module substrate having the construction as described above will be described hereinafter.

(a) When the Circuit Layer 18, Metallic Layer 17 and Heat Spreader 18 Are Formed Using Al After laminating an Al—Si foil (not shown), a buffer layer 14, an Al—Si foil, a metallic layer 17, an Al—Si foil, an insulation substrate 12, an Al—Si foil and a circuit layer 16 on the heat spreader 18 at first, a load of 0.5 to 5 kgf/cm² is applied to the laminate, which is heated at 600 to 650° C. in vacuum to form the laminate. Productivity of the power module substrate 11 is improved since the laminate is manufactured by applying one time of heat treatment to an integrated member of the heat spreader 18, buffer layer 14, metallic layer 17, insulation substrate 12 and circuit layer 16. Then, after forming a circuit pattern on the circuit layer 16 of the laminate by etching, a semiconductor chip 23 is mounted on the circuit layer 16 of the laminate. The laminate is placed on the water cooled sink 19, and the heat spreader 18 is fixed to the water cooled sink 19 with external threads 21.

(b) When the Circuit Layer 16, the Metallic Layer 17 and the Heat Spreader 18 Are Formed Using Cu After laminating an Ag—Cu—Ti foil (not shown), a buffer layer 14, an Ag—Cu—Ti foil, a metallic layer 17, an Ag—Cu—Ti foil, an insulation substrate 12, and an Ag—Cu—Ti foil on the heat spreader 18, a load of 0.5 to 5.0 kgf/cm$^2$ is applied to the laminate, which is heated at 620 to 900° C. in vacuum to manufacture the laminate. Since the other manufacturing steps are the same as described in the process (a), repeated descriptions are omitted.

For manufacturing the power module substrate as described above, the insulation substrate 12, the buffer layer 14 and the heat spreader 18 are bonded at a temperature as high as 600 to 650° C. (when the circuit layer 16, the metallic layer 17 and the heat spreader 18 are formed using Al), or at a temperature as high as 620 to 900° C. (when the circuit layer 16, the metallic layer 17 and the heat spreader 18 are formed using Cu), followed by cooling at room temperature. However, the difference of deformation between the insulation substrate 12 and the heat spreader 18 caused by the difference of the thermal expansion coefficients between the insulation substrate 12 and the heat spreader 18 is absorbed by the buffer layer 14 having an intermediate thermal expansion coefficient of those of these members. Consequently, the load applied on the insulation substrate 12 is suppressed since the internal stress generated in the insulation substrate 12 is reduced. Also, since the difference of deformation between the insulation substrate 12 and the heat sink 13 caused by thermal expansion or thermal contraction is absorbed by the buffer layer 14, the solder layer 22 for mounting the semiconductor chip 23 on the circuit layer 16 is prevented from being degraded.

Figure 2:
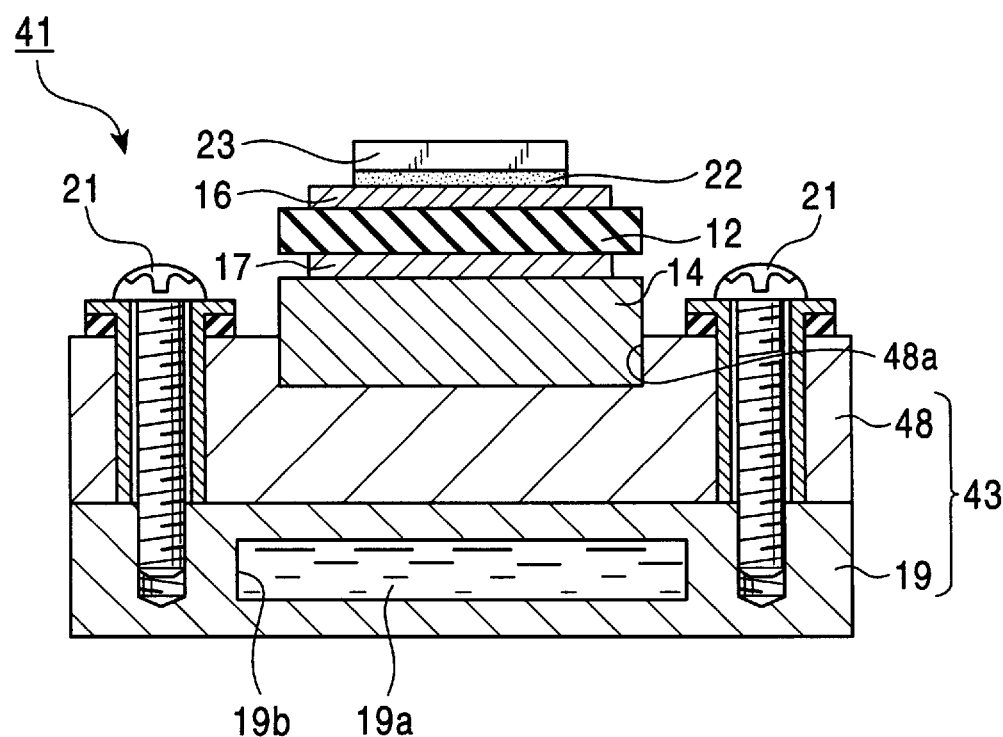
FIG. 2 is a cross section showing the second embodiment of the present invention corresponding to FIG. 1.

FIG. 2 shows the second embodiment of the present invention. The same reference numerals in FIG. 2 as used in FIG. 1 denote the same members.

In this embodiment, a groove 48a capable of inserting a buffer layer 14 is formed on the surface of a heat spreader 48 of a heat sink 43, and the buffer layer 14 inserted into the groove 48a is bonded to the heat spreader 48. The constructions other than those as described above are the same as the constructions described in the first embodiment.

Since the buffer layer 14 is placed close to the water cooled sink 19 in the power module substrate 41 constructed as described above, the heat generated in the semiconductor chip 23 is promptly transferred to the water cooled sink 19 from the buffer layer 14 through the heat spreader 48. Consequently, cooling efficiency by the heat sink 43 is improved because cooling water 19a passing through the water cooled sink 19 receives the heat and takes it out of the power module substrate 41, thereby avoiding the power module substrate 41 from being overheated. Since the manufacturing steps other than those described above is similar to those in the first embodiment, their repeated descriptions are omitted.

Figure 3:
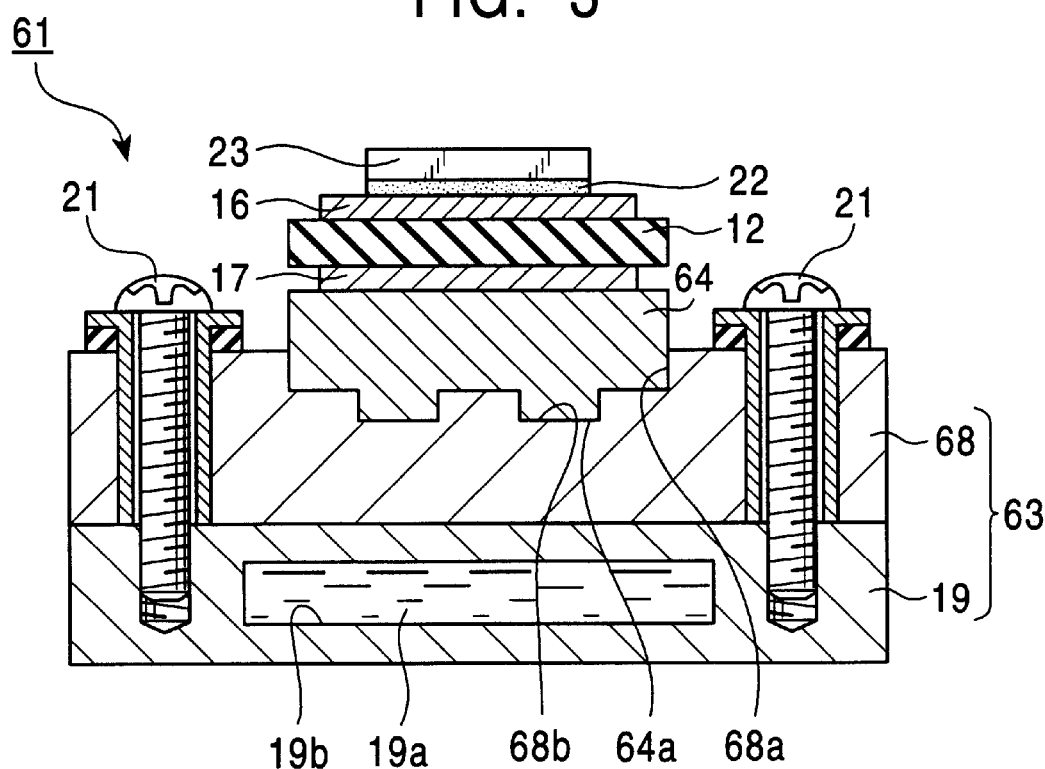
FIG. 3 is a cross section showing the third embodiment of the present invention corresponding to FIG. 1.

FIG. 3 shows the third embodiment of the present invention. The same reference numerals in FIG. 3 as used in FIG. 2 denote the same members.

In this embodiment, a groove 68a capable of inserting a buffer layer 64 is formed on the surface of a heat sink 63, a rough surface 68b is formed on the bottom face of the groove 68a, and a rough surface 68a corresponding to the rough surface 68b on the bottom face of the groove 68a is additionally formed on the bottom face of a buffer layer 64 inserted into the groove 68a. The other constructions other than those described above are the same as the constructions in the second embodiment.

The heat generated in semiconductor chips 23 is promptly transferred to the heat spreader 68 from the buffer layer 64, since the contact area between the buffer layer 64 and the heat spreader 68 is increased in the power module substrate 61 having the construction as described above. Since the manufacturing steps other than those described above is similar to those in the second embodiment, their repeated descriptions are omitted.

Although a groove capable of inserting the buffer layer is formed on the surface of the heat sink, and the buffer layer inserted into the groove is bonded to the buffer layer in the second and third embodiments, a recess capable of inserting the buffer layer may be formed on the surface of the heat sink, followed by bonding the buffer layer inserted into the recess to the heat sink.

Figure 4:
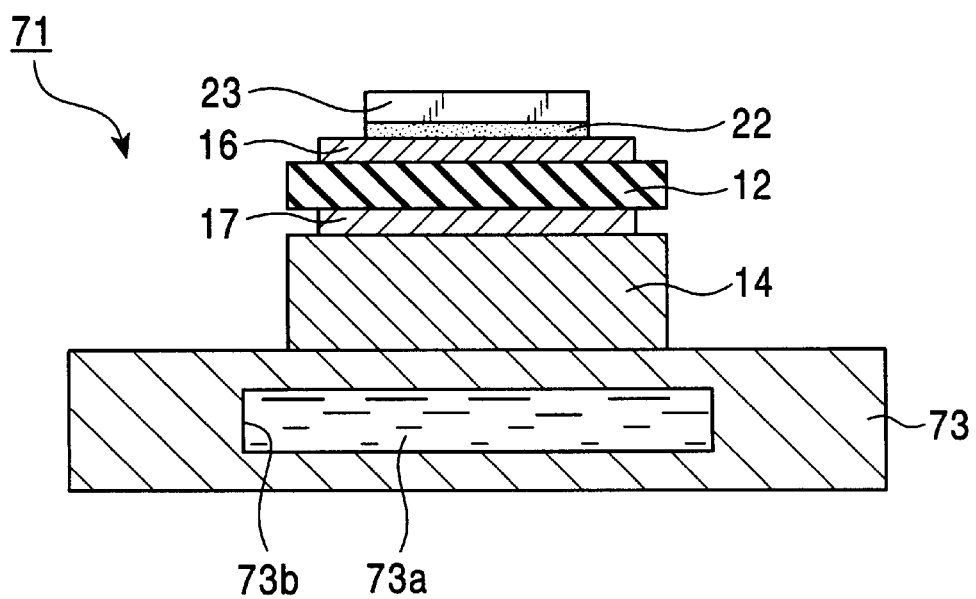
FIG. 4 is a cross section showing the fourth embodiment of the present invention corresponding to FIG. 1.
Figure 5:
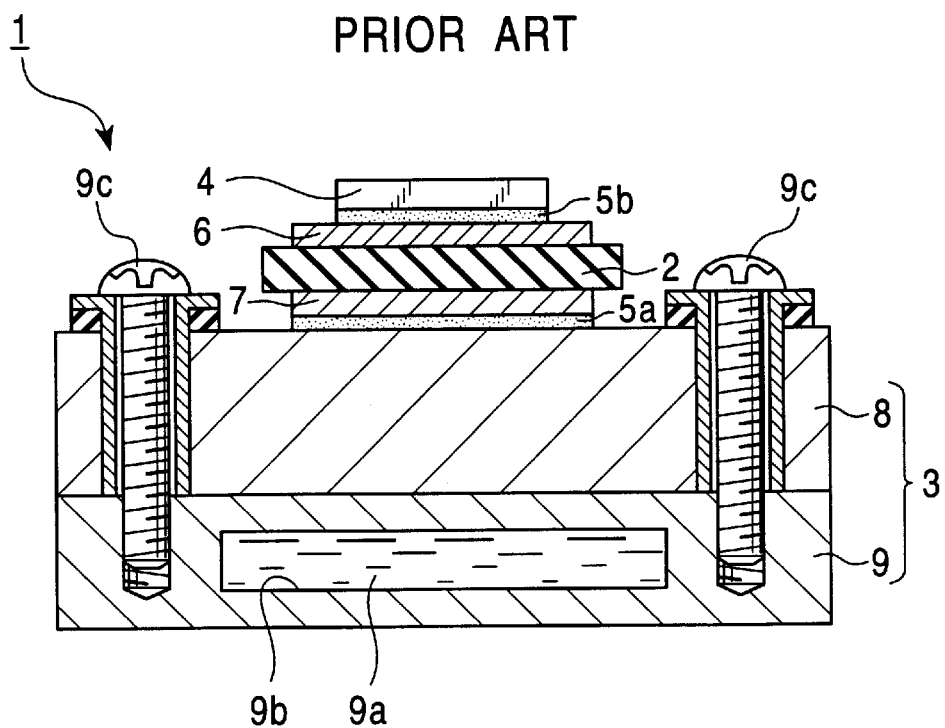
FIG. 5 is a cross section showing the conventional example corresponding to FIG. 1.
Figure 6:
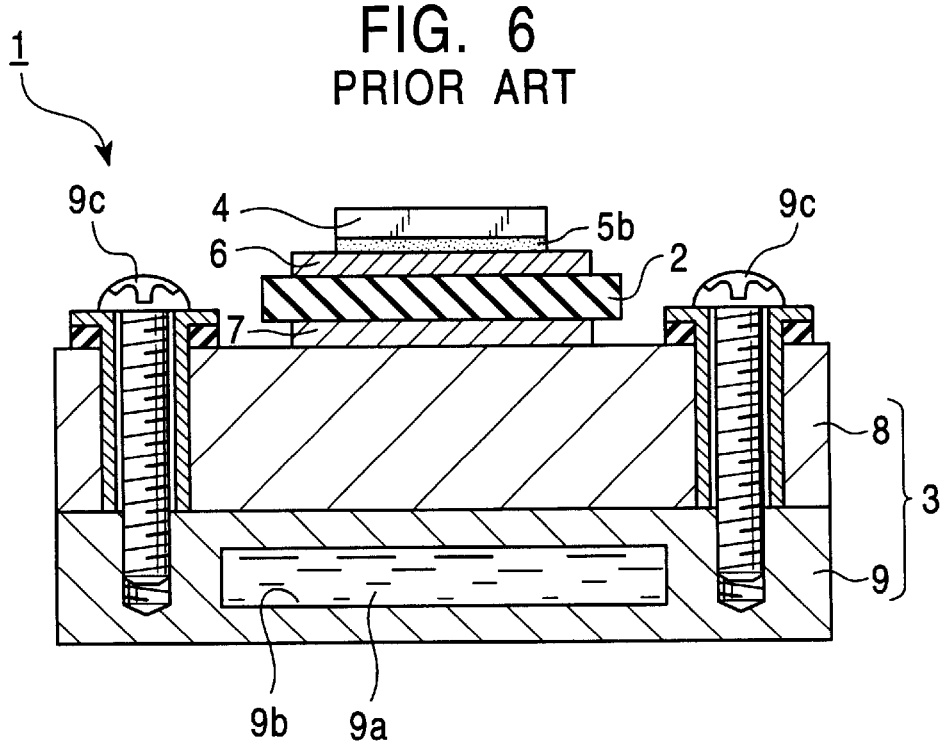
FIG. 6 is a cross section showing an another conventional example corresponding to FIG. 1.

FIG. 4 shows the fourth embodiment of the present invention. The same reference numerals in FIG. 4 as used in FIG. 1 denote the same members.

In this embodiment, a water cooled heat sink 73 inside of which a cooling water flow path 73b for allowing cooling water 73a to flow through is used as a heat sink. The water cooled heat sink 73 is formed using Al, and has a surface area one to three times as large as the surface area of an insulation substrate 12, and a thickness 1.5 to 50 times as thick as thickness of the insulation substrate 12. A buffer layer 14 is directly laminated on and bonded to the water cooled heat sink 73 via a brazing foil (not shown). An Al—Si foil comprising an alloy containing 87.0 to 96.0% by weight of Al and 4.0 to 13.0% by weight of Si is preferably used for the brazing foil. The constructions other than those as described are the same as described in the first embodiment.

The heat generated in the semiconductor chips 23 is promptly transferred to the water cooled heat sink 73 from the buffer layer 14 in the power module substrate 71 constructed as described above, since the buffer layer 14 is directly laminated on and bonded to the water cooled heat sink 73. Consequently, cooling efficiency by the water cooled heat sink 73 is further improved, because cooling water 73a flowing through the water cooled heat sink 73 receives the heat and takes the heat out of the power module substrate 71. Since the manufacturing steps other than those described above is similar to those in the first embodiment, their repeated descriptions are omitted.

According to the present invention as hitherto described, difference of deformation between the insulation substrate and the heat sink caused by the difference of the thermal expansion coefficients between the insulation substrate and the heat sink is absorbed by the buffer layer, because the buffer layer having a surface area one to three times as large as the surface area of the insulation substrate is inserted with bonding between the insulation substrate and the heat sink of the power module substrate, and the buffer layer is formed using a material having a thermal expansion coefficient between the thermal expansion coefficient of the insulation substrate and thermal expansion coefficient of the heat sink. Consequently, the internal stress generated in the insulation substrate is reduced thereby to suppress the load caused by the thermal stress in the insulation substrate.

The insulation substrate is formed using AlN, $Si_3N_4$ or $Al_2O_3$, the heat sink is formed using Al or Cu, and the buffer layer is formed using AlSiC, a carbon plate or an AlC composite material. Therefore, the production cost of the power module substrate according to the present invention can be reduced as compared with the conventional power module produced using expensive AlSiC.

When the buffer layer is formed to have a thickness 1.5 to 50 times as large as the thickness of the insulation substrate, the load applied on the insulation substrate due to thermal stress can be certainly suppressed because the difference of deformation between the insulation substrate and the heat sink caused by the difference of the thermal expansion coefficients between the insulation substrate and the heat sink is securely absorbed by the buffer layer.

An integrated member of the insulation substrate, the buffer layer and the heat sink can be manufactured by one time of heat treatment by laminating the insulation substrate, the buffer layer and the heat sink by laminating and bonding via the brazing foil, thereby allowing productivity of the power module substrate to be improved.

Since the buffer layer is place close to the water cooled sink by providing the heat spreader and the water cooled sink in the heat sink, by forming a groove or a recess capable of inserting the buffer layer on the surface of the heat spreader, and by bonding the buffer layer inserted into the groove or the recess to the heat spreader, the heat generated in a heating element such as the semiconductor chip is promptly transferred from the buffer layer to the water cooled sink through the heat spreader. Consequently, cooling efficiency by the heat sink is improved because cooling water flowing through the water cooled sink receives the heat and takes it out of the power module substrate, thereby preventing the power module substrate from being overheated. The cooling efficiency is further improved, on the other hand, when a water cooled heat sink is used as the heat sink, and when the buffer layer is directly laminated on and bonded to the water cooled heat sink via a brazing foil.

The difference of deformation by thermal expansion or thermal contraction of the insulation substrate and the heat sink is securely absorbed by the buffer layer, by forming the circuit layer on the upper face of the insulation substrate and by attaching the semiconductor chip on the circuit layer via a solder layer, thereby allowing the solder layer to be prevented from being degraded.

What is claimed is:

1. A power module substrate comprising:
   an insulation substrate;
   a heat sink; and
   a buffer layer provided between the insulation substrate and the heat sink to be connected to the insulation substrate and the heat sink, the buffer layer having a surface area one to three times larger than that of the insulation substrate,
   wherein the buffer layer is formed using a material having a thermal expansion coefficient between a thermal expansion coefficient of the insulation substrate and a thermal expansion coefficient of the heat sink, and
   wherein the buffer layer has a thickness 1.5 to 50 times as large as the thickness of the insulation substrate.

2. A power module substrate according to claim 1, wherein AlN, $Si_3N_4$ or $Al_2O_3$ is used for forming the insulation substrate, Al or Cu is used for forming the heat sink, and AlSiC, a carbon plate or a AlC composite material is used for forming the buffer layer.

3. A power module substrate according to claim 1, wherein the insulation layer, the buffer layer and the heat sink are laminated and bonded via a brazing foil.

4. A power module substrate according to claim 1 having a heat spreader in which the heat sink is bonded to the buffer layer, and a water-cooled sink, which is attached to the heat spreader and in which a cooling water flow path for allowing the cooling water to flow through, is formed,
   wherein a groove or a recess capable of inserting the buffer layer is formed on the surface of the heat spreader, and the buffer layer is bonded to the heat spreader by being inserted into either the groove or the recess.

5. A power module substrate according to claim 1 comprising:
   a water cooled heat sink in which a cooling water flow path for allowing cooling water to flow through is formed, and
   the buffer layer being directly laminated on and bonded to the water cooled heat sink via the brazing foil.

6. A power module substrate according to claim 1,
   wherein a circuit layer is formed on the insulation layer, and a semiconductor chip is attached to the circuit layer via a solder layer.

* * * * *